(12) United States Patent
Murillo (10) Patent No.: US 7,225,386 B2
(45) Date of Patent: May 29, 2007

(54) HIGH-EFFICIENCY ERROR DETECTION AND/OR CORRECTION CODE

(75) Inventor: Laurent Murillo, Meylan (FR)

(73) Assignee: STMicroelectronics S.A., Montrouge (FR)

(*) Notice: Subject to any disclaimer, the term of this patent is extended or adjusted under 35 U.S.C. 154(b) by 371 days.

(21) Appl. No.: 10/264,312

(22) Filed: Oct. 3, 2002

(65) Prior Publication Data

US 2003/0070135 A1    Apr. 10, 2003

(30) Foreign Application Priority Data

Oct. 5, 2001    (FR) ................... 01 12862

(51) Int. Cl.
*H03M 13/00*    (2006.01)
(52) U.S. Cl. .............. 714/758; 714/785; 714/786; 714/799
(58) Field of Classification Search ............. 714/785, 714/804, 755, 752, 799, 758
See application file for complete search history.

(56) References Cited

U.S. PATENT DOCUMENTS

| 5,751,744 A | | 5/1998 | Babb |
| 5,802,078 A | * | 9/1998 | Urabe et al. ............... 714/759 |
| 6,336,203 B1 | * | 1/2002 | Yoshida ..................... 714/785 |

OTHER PUBLICATIONS

French Search Report from French Patent Application No. 01/12862, filed Oct. 5, 2001.

* cited by examiner

*Primary Examiner*—Albert Decady
*Assistant Examiner*—Esaw T. Abraham
(74) *Attorney, Agent, or Firm*—Lisa K. Jorgenson; William R. McClellan; Wolf, Greenfield & Sacks, P.C.

(57) ABSTRACT

Error detection and correction codes are provided. For a word of m bits that is to be coded, a vector with m components, each component corresponding to a bit of the word, is formed. The vector is multiplied, using a computing circuit, by a parity control matrix. The parity control matrix includes at least one couple of complementary lines.

11 Claims, 6 Drawing Sheets

$$M = \begin{pmatrix} 0 & 0 & 0 & 0 & 0 & 0 & 0 & 0 & 1 & 1 & 1 & 1 & 1 & 1 & 1 & 1 \\ 0 & 0 & 0 & 0 & 1 & 1 & 1 & 1 & 0 & 0 & 0 & 0 & 1 & 1 & 1 & 1 \\ 1 & 0 & 1 & 1 & 0 & 0 & 1 & 1 & 0 & 0 & 1 & 1 & 0 & 0 & 1 & 1 \\ 1 & 1 & 0 & 1 & 0 & 1 & 0 & 1 & 0 & 1 & 0 & 1 & 0 & 1 & 0 & 1 \\ 0 & 1 & 1 & 1 & 1 & 1 & 1 & 0 & 1 & 0 & 0 & 0 & 0 & 0 & 0 & 1 \\ 1 & 0 & 0 & 0 & 0 & 0 & 0 & 1 & 0 & 1 & 1 & 1 & 1 & 1 & 1 & 0 \end{pmatrix}$$

$$H = \begin{pmatrix} 0 & 0 & 0 & 0 & 0 & 0 & 0 & 0 & 0 & 0 & 0 & 1 & 1 & 1 & 1 & 1 \\ 0 & 0 & 0 & 0 & 1 & 1 & 1 & 1 & 1 & 1 & 1 & 0 & 0 & 0 & 0 & 0 \\ 0 & 1 & 1 & 1 & 0 & 0 & 0 & 1 & 1 & 1 & 1 & 0 & 0 & 0 & 1 & 1 \\ 1 & 0 & 1 & 1 & 0 & 1 & 1 & 0 & 0 & 1 & 1 & 0 & 1 & 1 & 0 & 0 \\ 1 & 1 & 0 & 1 & 1 & 0 & 1 & 0 & 1 & 0 & 1 & 1 & 0 & 1 & 0 & 1 \end{pmatrix}$$

Fig 1A
(Prior Art)

$$\begin{pmatrix} c_0 \\ c_1 \\ c_2 \\ c_3 \\ c_4 \end{pmatrix} = H * \begin{pmatrix} x_0 \\ x_1 \\ \vdots \\ x_{15} \end{pmatrix}$$

Fig 1B
(Prior Art)

$$H' = \begin{pmatrix} 0 & 0 & 0 & 0 & 0 & 0 & 0 & 0 & 0 & 0 & 1 & 1 & 1 & 1 & 1 & 1 & 0 & 0 & 0 & 0 \\ 0 & 0 & 0 & 0 & 1 & 1 & 1 & 1 & 1 & 1 & 0 & 0 & 0 & 0 & 0 & 0 & 1 & 0 & 0 & 0 \\ 0 & 1 & 1 & 1 & 0 & 0 & 0 & 1 & 1 & 1 & 0 & 0 & 0 & 1 & 1 & 0 & 0 & 1 & 0 & 0 \\ 1 & 0 & 1 & 1 & 0 & 1 & 1 & 0 & 0 & 1 & 1 & 0 & 1 & 1 & 0 & 0 & 0 & 0 & 1 & 0 \\ 1 & 1 & 0 & 1 & 1 & 0 & 1 & 0 & 1 & 0 & 1 & 1 & 0 & 1 & 0 & 1 & 0 & 0 & 0 & 1 \end{pmatrix}$$

(with upper-left 5×16 block labeled H)

Fig 2A
(Prior Art)

$$S = \begin{pmatrix} S_0 \\ S_1 \\ S_2 \\ S_3 \\ S_4 \end{pmatrix} = H' * \begin{pmatrix} X_r \\ C_r \end{pmatrix}$$

Fig 2B
(Prior Art)

$$H'' = \begin{pmatrix} \overbrace{\begin{matrix} 0 & 0 & 0 & 0 & 0 & 0 & 0 & 0 & 0 & 0 & 0 & 1 & 1 & 1 & 1 & 1 & 1 & 0 & 0 & 0 & 0 \\ 0 & 0 & 0 & 0 & 1 & 1 & 1 & 1 & 1 & 1 & 1 & 0 & 0 & 0 & 0 & 0 & 0 & 1 & 0 & 0 & 0 \\ 0 & 1 & 1 & 1 & 0 & 0 & 0 & 1 & 1 & 1 & 1 & 0 & 0 & 0 & 1 & 1 & 0 & 0 & 1 & 0 & 0 \\ 1 & 0 & 1 & 1 & 0 & 1 & 1 & 0 & 0 & 1 & 1 & 0 & 1 & 1 & 0 & 0 & 0 & 0 & 0 & 1 & 0 \\ 1 & 1 & 0 & 1 & 1 & 0 & 1 & 0 & 1 & 0 & 1 & 1 & 0 & 1 & 0 & 1 & 0 & 0 & 0 & 0 & 1 \end{matrix}}^{H'} & 0 \\ \underbrace{\begin{matrix} 1 & 1 & 1 & 1 & 1 & 1 & 1 & 1 & 1 & 1 & 1 & 1 & 1 & 1 & 1 & 1 & 1 & 1 & 1 & 1 & 1 \end{matrix}}_{D} \end{pmatrix}$$

Fig 3A
(Prior Art)

$$S' = \begin{pmatrix} S_0 \\ S_1 \\ S_2 \\ S_3 \\ S_4 \\ S_5 \end{pmatrix} = H'' * \begin{pmatrix} X_r \\ C_r \\ P_r \end{pmatrix}$$

Fig 3B
(Prior Art)

$$M = \begin{pmatrix} 0 & 0 & 0 & 0 & 0 & 0 & 0 & 0 & 1 & 1 & 1 & 1 & 1 & 1 & 1 & 1 \\ 0 & 0 & 0 & 0 & 1 & 1 & 1 & 1 & 0 & 0 & 0 & 0 & 1 & 1 & 1 & 1 \\ 1 & 0 & 1 & 1 & 0 & 0 & 1 & 1 & 0 & 0 & 1 & 1 & 0 & 0 & 1 & 1 \\ 1 & 1 & 0 & 1 & 0 & 1 & 0 & 1 & 0 & 1 & 0 & 1 & 0 & 1 & 0 & 1 \\ 0 & 1 & 1 & 1 & 1 & 1 & 1 & 0 & 1 & 0 & 0 & 0 & 0 & 0 & 0 & 1 \\ 1 & 0 & 0 & 0 & 0 & 0 & 0 & 1 & 0 & 1 & 1 & 1 & 1 & 1 & 1 & 0 \end{pmatrix}$$

Fig 4A $$M' = \begin{pmatrix} 0 & 0 & 0 & 0 & 0 & 0 & 0 & 1 & 1 & 1 & 1 & 1 & 1 & 1 & 1 & 1 & 0 & 0 & 0 & 0 & 0 \\ 0 & 0 & 0 & 0 & 1 & 1 & 1 & 1 & 0 & 0 & 0 & 0 & 1 & 1 & 1 & 0 & 1 & 0 & 0 & 0 & 0 \\ 1 & 0 & 1 & 1 & 0 & 0 & 1 & 1 & 0 & 0 & 1 & 1 & 0 & 0 & 1 & 1 & 0 & 0 & 1 & 0 & 0 & 0 \\ 1 & 1 & 0 & 1 & 0 & 1 & 0 & 1 & 0 & 1 & 0 & 1 & 0 & 1 & 0 & 1 & 0 & 0 & 0 & 1 & 0 & 0 \\ 0 & 1 & 1 & 1 & 1 & 1 & 1 & 0 & 1 & 0 & 0 & 0 & 0 & 0 & 0 & 1 & 0 & 0 & 0 & 0 & 1 & 0 \\ 1 & 0 & 0 & 0 & 0 & 0 & 0 & 1 & 0 & 1 & 1 & 1 & 1 & 1 & 1 & 0 & 1 & 1 & 1 & 1 & 0 & 1 \end{pmatrix}$$

Fig 4D $$M_{32} = \begin{pmatrix} 0\,0\,0\,0\,0\,0\,0\,0\,0\,0\,0\,0\,0\,0\,0\,0 & 1\,1\,1\,1\,1\,1\,1\,1\,1\,1\,1\,1\,1\,1\,1\,1 \\ 0\,0\,0\,0\,0\,0\,0\,0\,1\,1\,1\,1\,1\,1\,1\,1 & 0\,0\,0\,0\,0\,0\,0\,0\,1\,1\,1\,1\,1\,1\,1\,1 \\ 0\,0\,0\,0\,1\,1\,1\,1\,0\,0\,0\,0\,1\,1\,1\,1 & 0\,0\,0\,0\,1\,1\,1\,1\,0\,0\,0\,0\,1\,1\,1\,1 \\ 1\,0\,1\,1\,0\,0\,1\,1\,0\,0\,1\,1\,0\,0\,1\,1 & 0\,0\,1\,1\,0\,0\,1\,1\,0\,0\,1\,1\,0\,0\,1\,1 \\ 1\,1\,0\,1\,0\,1\,0\,1\,0\,1\,0\,1\,0\,1\,0\,1 & 0\,1\,0\,1\,0\,1\,0\,1\,0\,1\,0\,1\,0\,1\,0\,1 \\ 0\,1\,1\,1\,1\,1\,1\,1\,1\,1\,1\,1\,1\,1\,1\,0 & 1\,0\,0\,0\,0\,0\,0\,0\,0\,0\,0\,0\,0\,0\,0\,1 \\ 1\,0\,0\,0\,0\,0\,0\,0\,0\,0\,0\,0\,0\,0\,0\,1 & 0\,1\,1\,1\,1\,1\,1\,1\,1\,1\,1\,1\,1\,1\,1\,0 \end{pmatrix}$$

K'1 brackets the lower-left block, K'2 brackets the upper-right portion with L' the lower-right block. The matrix is partitioned by axes Y–Y' (vertical) between columns 16 and 17.

Fig 5A $$M'_{32} = \begin{pmatrix} 0\,0\,0\,0\,0\,0\,0\,0\,0\,0\,0\,0\,0\,0\,0\,0\,1\,1\,1\,1\,1\,1\,1\,1\,1\,1\,1\,1\,1\,1\,1\,1 & 1\,0\,0\,0\,0\,0\,0 \\ 0\,0\,0\,0\,0\,0\,0\,0\,1\,1\,1\,1\,1\,1\,1\,1\,0\,0\,0\,0\,0\,0\,0\,0\,1\,1\,1\,1\,1\,1\,1\,1 & 0\,1\,0\,0\,0\,0\,0 \\ 0\,0\,0\,0\,1\,1\,1\,1\,0\,0\,0\,0\,1\,1\,1\,1\,0\,0\,0\,0\,1\,1\,1\,1\,0\,0\,0\,0\,1\,1\,1\,1 & 0\,0\,1\,0\,0\,0\,0 \\ 1\,0\,1\,1\,0\,0\,1\,1\,0\,0\,1\,1\,0\,0\,1\,1\,0\,0\,1\,1\,0\,0\,1\,1\,0\,0\,1\,1\,0\,0\,1\,1 & 0\,0\,0\,1\,0\,0\,0 \\ 1\,1\,0\,1\,0\,1\,0\,1\,0\,1\,0\,1\,0\,1\,0\,1\,0\,1\,0\,1\,0\,1\,0\,1\,0\,1\,0\,1\,0\,1\,0\,1 & 0\,0\,0\,0\,1\,0\,0 \\ 0\,1\,1\,1\,1\,1\,1\,1\,1\,1\,1\,1\,1\,1\,1\,0\,1\,0\,0\,0\,0\,0\,0\,0\,0\,0\,0\,0\,0\,0\,0\,1 & 0\,0\,0\,0\,0\,1\,0 \\ 1\,0\,0\,0\,0\,0\,0\,0\,0\,0\,0\,0\,0\,0\,0\,1\,0\,1\,1\,1\,1\,1\,1\,1\,1\,1\,1\,1\,1\,1\,1\,0 & 1\,1\,1\,1\,1\,0\,1 \end{pmatrix}$$

with the left portion labeled $M_{32}$ and the right portion labeled $R$.

Fig 5B

HIGH-EFFICIENCY ERROR DETECTION AND/OR CORRECTION CODE

BACKGROUND OF THE INVENTION

1. Field of the Invention

The present invention relates to error detection and/or correction codes.

Error detection codes have a technical effect and solve a significant technical problem. Indeed, they enable restoring the value of one or several erroneous bits, for example, after a storage or a transmission. Without such codes, any storage or transmission of digital data would be difficult.

The present invention relates in particular to linear codes of Hamming type.

2. Discussion of the Related Art

The Hamming code is an error detection and correction code used in many fields. A first example of a Hamming code and its use for the data storage in a memory will be described, in the case where the data to be stored are in the form of 16-bit words.

Let X be the word to be stored. X can be represented by a vector $X_e$, the 16 components $X_0$ to $X_{15}$ of which correspond to the 16 bits of the word to be stored. Five error detection bits $C_1(C_0 \ldots C_4)$ are obtained by multiplying a parity control matrix H, called a Hamming matrix, of dimensions 5×16, by vector $X_e$ in the form of a column vector.

Figure 1A:
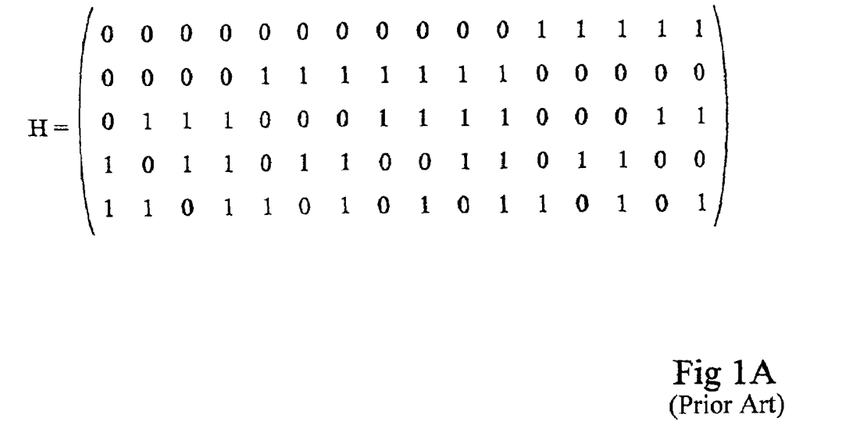
FIGS. 1A and 1B, previously described, respectively show a Hamming matrix H and the way to obtain detection bits to code a 16-bit word.
Figure 1B:
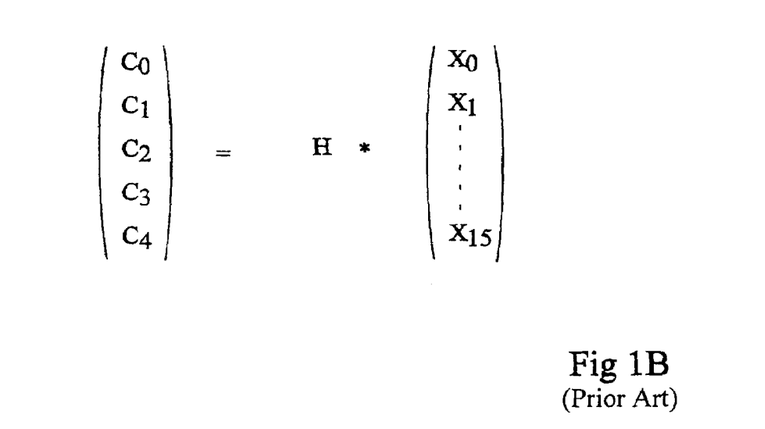

FIG. 1A illustrates Hamming matrix H for 16 bits and FIG. 1B illustrates the way to obtain the detection bits. Calling $h_{ij}$ the elements of matrix H, the error detection bits $C_1$ are given by:

$$C_i = \sum_{j=0}^{15} h_{ij} \cdot X_j$$

$X_j$ being the j-th component of vector $X_e$.

In write mode, 21-bit words, formed of the 16 data bits $X_j$ and of the 5 detection bits $C_1$, are written into the memory. In read mode, the read word includes 16 bits $X_r$ corresponding to the data bits and 5 bits $C_r$ corresponding to the detection bits. It is possible for $X_r$ and $C_r$ not to be equal to $X_j$ and $C_i$ if errors have occurred between the write and read operations.

To detect and/or correct possible errors on the read bits, a syndrome S with five components $S_0, \ldots S_4$ is calculated by multiplying a determined matrix H' of dimensions 5×21 by a column vector with 21 components, including the 16 bits $X_r$ and the 5 bits $C_r$.

Figure 2A:
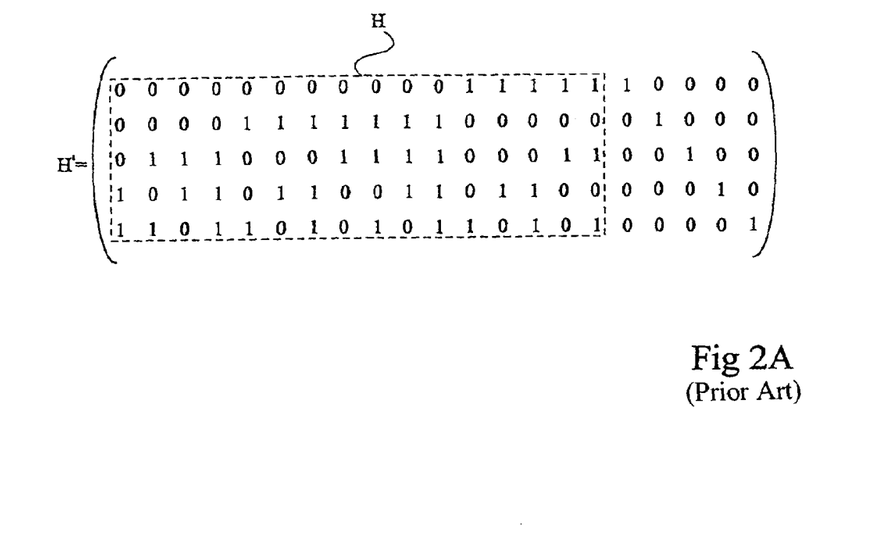
FIGS. 2A and 2B, previously described, respectively show a Hamming matrix H' for calculating a syndrome and the syndrome calculation mode for a 16-bit word.

FIG. 2A illustrates matrix H'. The first 16 columns of matrix H' correspond to the 16 columns of matrix H. The 5 following columns each include a single "1". The 17-th column has its "1" on the first line, the 18-th column has its "1" on the second line, and so on until the 21rst column, which has its "1" on the fifth line. The last five columns of matrix H' are used to determine possible errors in the detection bits.

Figure 2B:
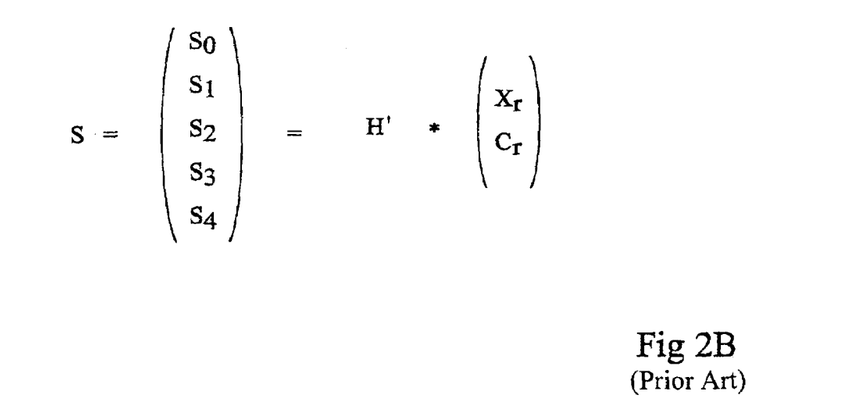

FIG. 2B illustrates the calculation of syndrome S.

If syndrome S has all its components equal to 0, the storage occurs with no error and all the bits of the read word, be they data bits or detection bits, are correct.

If S is different from 0, the read word includes one or several errors. If a single bit of the read word is erroneous, the obtained syndrome enables correcting the error. Indeed, the syndrome corresponds in this case to the column having had its elements multiplied by the erroneous bit. Thus, if the calculated syndrome is equal to:

$$S = \begin{pmatrix} 0 \\ 0 \\ 0 \\ 1 \\ 1 \end{pmatrix},$$

the components (00011) of the syndrome correspond to the elements of the first column of the Hamming matrix, which means that the first bit, $X_0$, is erroneous.

Similarly, if the calculated syndrome is equal to:

$$S'' = \begin{pmatrix} 1 \\ 0 \\ 0 \\ 0 \\ 0 \end{pmatrix},$$

and there is a single error in the read word, this means that the first detection bit $C_0$ is erroneous.

The above-described Hamming code cannot detect two errors. Thus, if an error has occurred on bits $X_1$ and $X_2$, the obtained syndrome is equal to the sum modulo 2 of the syndromes corresponding to errors on $X_1$ and $X_2$, that is, to: S'''=(00101)+(00110)=(00011). The obtained syndrome indicates an error on bit $X_0$, which is wrong.

Indeed, the above Hamming code is known to have a minimum code distance d=3 and a linear code like the Hamming code is known to be able to correct L errors and to detect L+1 errors if its minimum code distance d is strictly greater than 2L+1.

To improve the above code and turn it into a code having a minimum code distance equal to 4, it is known to add to the word to be stored a total parity bit P.

Total parity bit P is calculated by adding modulo 2 all the data bits and all the detection bits. The total parity bit is added to the word to be stored, and the word to be stored, the detection bits, and the total parity bit are altogether stored.

Figure 3A:
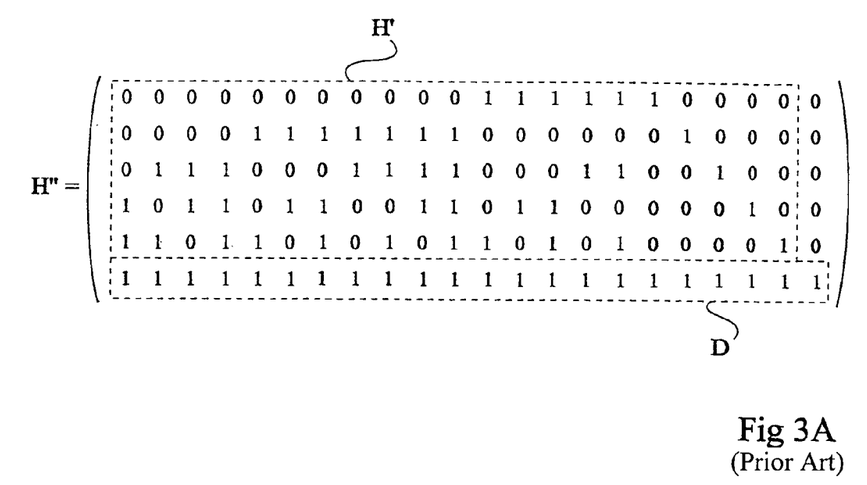
FIGS. 3A and 3B, previously described, respectively illustrate a Hamming matrix H" used in a code enabling detection of two errors for 16-bit words and the corresponding syndrome calculation mode.

In read mode, the read word is multiplied by parity control matrix H" shown in FIG. 3A. Matrix H" has one more line and one more column than matrix H'. Matrix H" includes, to the top left, that is, on the first five lines and on the first 21 columns, a block identical to matrix H'. The last line D of matrix H" only includes "1s" and the last line of matrix H" only includes "0s", except for the last line.

Figure 3B:
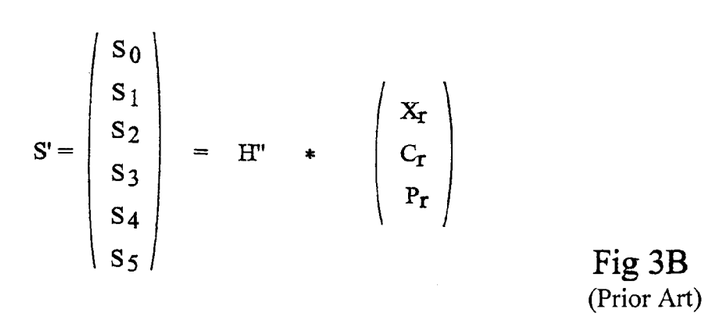

The obtained syndrome S' is illustrated in FIG. 3B. Syndrome S' has six components $S_0$ to $S_5$, and is obtained by multiplying matrix H" by a column vector including the 22 bits of the read word, formed of the 16 read data bits $X_r$, followed by the five read detection bits $C_r$, and by the read total parity bit $P_r$.

The code thus obtained is a so-called "SEC-DED" code ("Single Error Correction"—"Double Error Detection"). This code has a minimum code distance equal to four and can detect two errors in all cases, two errors being indicated by the fact that the last component of the syndrome, $S_5$, is zero while the syndrome is different from the zero vector. However, the above code has several disadvantages.

Thus, upon coding, the calculation of total parity bit P is required. This calculation requires a large number of adders, since all data bits and detection bits must be added modulo 2. Further, the calculation of the total parity bit cannot be performed in parallel with the calculation of the detection bits, since it requires the previous knowledge of the detection bits. Accordingly, it must be awaited that all detection bits have been calculated to calculate total parity bit P, which wastes time.

Upon decoding, the calculation of the last syndrome component, $S_5$, requires a high number of adders, and the decoding circuit has a low compactness. Further, since each addition lasts for some time, the calculation of the last syndrome component has a relatively long duration and the decoding is not optimal.

It should also be noted that, in the above-described Hamming code, the Hamming matrix is neither symmetrical, nor regular. Thus, considering that the elements of a column correspond to the binary representation of a number, the variation of this number is not regular and includes jumps. This makes difficult the forming of a circuit implementing the Hamming code as well as the syndrome decoding.

SUMMARY OF THE INVENTION

An object of the present invention is to provide an error detection and/or correction code which is simpler than the corresponding Hamming code.

Another object of the present invention is to provide a method and a device for implementing such an error detection and/or correction code.

Another object of the present invention is to provide a method and a device for implementing an error detection and/or correction code that can be implemented in a simple way by an integrated circuit.

To achieve these objects as well as others, the present invention provides a method for determining r error detection bits of a word of m bits to be coded, including the step of calculating the product of a vector with m components representative of said word of m bits to be coded and of a parity control matrix. The parity control matrix includes at least one couple of complementary lines.

According to an embodiment of the present invention, the binary representation of the r−2 first bits of each column indicates the column rank, except for the first column, of rank 0.

According to an embodiment of the present invention, in is an even number, and the parity control matrix is such that:

a) the first half of the penultimate line, corresponding to the m/2 first columns, includes a "0" at each end and "1s" everywhere else, b) the second half of the penultimate line, corresponding to the last m/2 columns, includes a "1" at each end and "0s" everywhere else, and c) the last line is complementary to the penultimate line.

According to an embodiment of the present invention, two or more than two lines and/or columns are permuted.

According to an embodiment of the present invention, number r of the detection bits is equal to n+2, n being the number of bits necessary to binarily represent number m of bits of the word to be coded.

The present invention also relates to a method for determining a syndrome representative of possible errors having occurred in a processing to an m+r-bit word, the m+r bits corresponding, before processing, to m bits of a word to be coded and r error detection bits obtained by a method such as described hereabove applied to the word of m bits to be coded, the syndrome being obtained in a step consisting of multiplying a specific matrix by a vector having m+r components representative of the m+r-bit word. The specific matrix includes:

a) a first left-hand block corresponding to the parity control matrix used in the coding and;

b) a second square block of dimension r−1, in the form of a diagonal matrix including only "1s" on its diagonal, c) a last column only including "0s" on the r−1 first lines and a "1" on the last line, and d) under the second block, elements which are complements to two of those of the last line of the second block.

The present invention also relates to an error correction and/or detection code using a matrix such as defined hereabove.

The present invention also relates to a coding circuit enabling implementation of an error correction and/or detection code such as defined hereabove, including elementary adders, the distribution of the elementary adders corresponding to the distribution of the "1s" in a matrix such as defined hereabove in the method for determining r error detection bits.

The present invention also relates to a decoding circuit enabling implementation of an error correction and/or detection code such as defined hereabove, including elementary adders, the distribution of the elementary adders corresponding to the distribution of the "1s" in a matrix such as defined hereabove in the method for determining a syndrome.

According to an embodiment of the present invention, the elementary adders are formed by gates of XOR type.

The foregoing objects, features and advantages of the present invention will be discussed in detail in the following non-limiting description of specific embodiments in connection with the accompanying drawings.

DETAILED DESCRIPTION

Figure 4A:
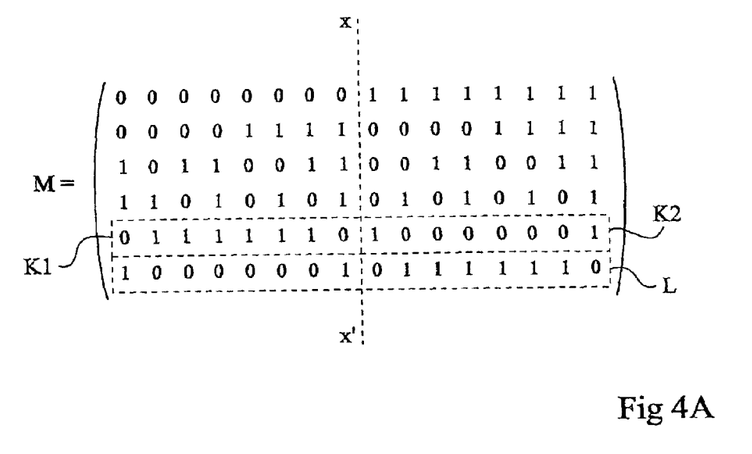
FIG. 4A shows a parity control matrix M according to the present invention for coding a 16-bit word.

FIG. 4A illustrates a parity control matrix M for calculating the detection bits for 16-bit words, in an error correction/detection code according to the present invention. The number of detection bits is equal to 6 and matrix M is a matrix of dimension 6×16. Each column of matrix M is different from another column and the columns of matrix M are linearly independent two by two.

Matrix M is formed as follows. The first column of the matrix corresponds to rank 0. For the other columns, elements are placed on the first four lines, the binary representation of which indicates the column rank. Thus, the second column, of rank 1, includes on the first four lines elements "0001", which are the binary representation of number 1. The sixteenth column (rank 15) includes on the first four lines elements 1111, which are the binary representation of number 15. The first four elements of the first columns have been chosen to be equal to "0011", which correspond to the first four elements of the column of rank 3. This choice is not critical and, for the first four elements of the first column, the first four elements of any column of matrix M could have been taken, as will be seen hereafter, provided that they include more than a single "1".

After the first four lines, the fifth and penultimate lines of matrix M are formed. For this purpose, matrix M is divided in two by a median axis xx' separating the 16 columns in 8 left-hand columns (rank 0 to 7) and 8 right-hand columns (rank 8 to 15). The first half of the fifth line, corresponding to a block $K_1$ of 8 elements to the left of axis xx', is formed by placing a "0" at each end of block $K_1$ and "1s" everywhere else. Thus, the first half of the fifth line has expression "01111110". To form the second half of the fifth line, corresponding to a block $K_2$, a "1" is placed at each end of block $K_2$ and "0s" are placed everywhere else. The fifth line thus has as full expression "0111111010000001".

The elements of the last and sixth line L of matrix M are the complements to two of the elements of the fifth line. Line L thus has as expression "1000000101111110".

The matrix M thus formed has distinct columns linearly independent two by two. When matrix M is multiplied by a column vector of sixteen components corresponding to the bits of the word to be coded, six detection bits $C_0$–$C_5$ are obtained, which are added to the word to be coded to form a 22-bit coded word. The decoding of the coded word enables correction of an error and detection of two errors.

It should be noted that matrix M includes a line couple, the last and the penultimate lines, which are complementary to each other. This provides a significant advantage to the code of the present invention. In particular, the provided code thereby avoids calculation of a total parity bit upon coding. The coding circuit is thus more compact and includes less adders than in prior art. All the bits added to the word to be coded can be calculated in parallel, which results in a great time gain.

Figure 4B:
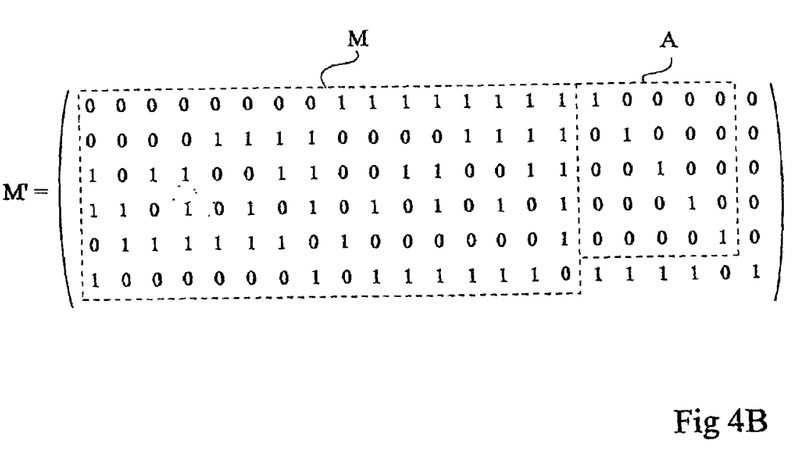
FIG. 4B shows a matrix M' used to calculate a syndrome according to the present invention.

FIG. 4B illustrates matrix M' used upon decoding. Upon decoding, a 22-bit word (16 data bits and 6 detection bits) is decoded after any processing. "Processing" means any manipulation of the word to be coded, for example, the storage in a memory or the transmission by wire or radio means. The word to be decoded is multiplied by matrix M' to form a syndrome with six components $S_0$–$S_5$. Matrix M' is a matrix of dimension 6×22, like matrix H" of FIG. 3A. In matrix M', the first sixteen columns form a block identical to matrix M. The first five lines of the next five columns (rank 16 to 20) form a block A of dimension 5×5 formed by a diagonal matrix including only 1s on its main diagonal and 0s everywhere else. Under block A, the elements of the last lines of the columns of rank 16 to 20 are chosen to be equal to "11110", to correspond to the complements to two of the elements of the last line of block A ("00001"). The last column of matrix M', which enables correction of an error on the sixth detection bit, includes "0s" on the first five lines and a "1" on the last line.

It should be noted that, like for matrix M, the last two lines of matrix M' are complementary. Thus, if the sum modulo 2 of the last two syndrome components, $S_4$ and $S_5$, is calculated, the sum modulo 2 of all data and detection bits of the word to be decoded, that is, a total parity bit $P_r$, is obtained by a simple calculation substantially using twice as few adders and as less time as in the case of the corresponding Hamming code. Upon decoding, total parity bit $P_r$, obtained without calculation of a total parity bit upon coding, is used as follows.

If the obtained syndrome is equal to the zero vector, there is no error, either on the data bits, or on the detection bits.

If the obtained syndrome is different from the zero vector and total parity bit $P_r$ is equal to 1, this means that there is a single error and it can be corrected. Indeed, the syndrome components, in this case, correspond to the elements of the column of matrix M' corresponding to the erroneous bit. Further, since the first four syndrome components indicate the rank of the erroneous bit except for the first one, it is very easy to determine the position of the erroneous bit and to correct it. This is an additional advantage over the Hamming code.

If the syndrome is different from the zero vector and total parity bit $P_r$ is equal to 0, two errors are present, which are detected.

Figure 4C:
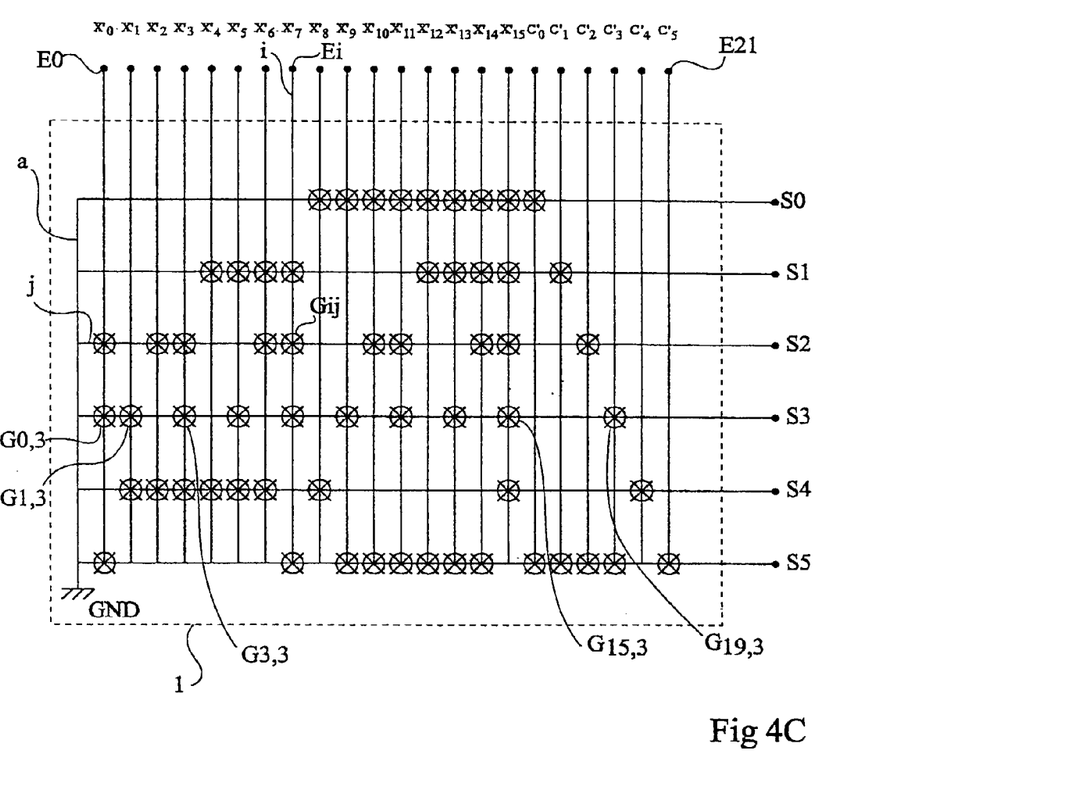
FIG. 4C schematically shows a decoding circuit for decoding a word coded by means of matrix M.

FIG. 4C schematically shows a circuit 1 for calculating the preceding syndrome. On 22 inputs $E_0$ to $E_{21}$, the circuit receives the 22 bits of the word to be coded, that is, 16 data bits $X'_0$ to $X'_{15}$ and 6 detection bits $C'_0$ to $C'_5$. The circuit includes 6 outputs $S_0$ to $S_5$ providing the six syndrome components. Each input E, is connected to a column of rank i of the circuit. Each output $S_j$ is connected to a column of rank j. At the intersection of column i and of line j, there may be an adder modulo 2 $G_{i,j}$ indicated by a circle marked with a cross. The adders are for example formed by XOR gates.

Figure 4D:
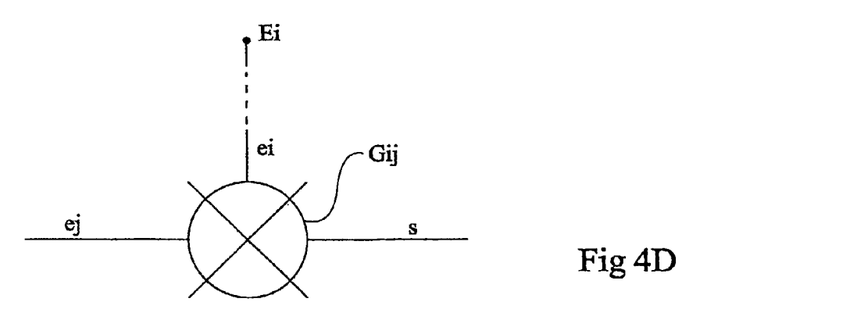
FIG. 4D shows an element of the circuit of FIG. 4C.

As shown in FIG. 4D, adder $G_{i,j}$ includes two inputs $e_i$ and $e_j$. Input $e_i$ is connected to input $E_i$ and input $e_j$ receives the signal present on line j to the left of adder $G_{i,j}$. Adder $G_{i,j}$ also includes an output s located on line j to the right of adder $G_{i,j}$.

When there is no adder at the intersection of column i and of line j, this means that column i and line j cross with no influence upon each other. This means that the bit provided to the involved input is not used to calculate component $S_j$ of the syndrome.

An additional column a, located to the left of column 0, connects input $e_j$ of each first adder of a line to a grounded line (GND).

The operation of the decoding circuit will be explained for the calculation of component $S_3$ of the syndrome, corresponding to the line of rank 3. Starting from the left, the first encountered adder is adder $G_{0,3}$. Input $e_3$ of adder $G_{0,3}$ is connected to ground and its input e0 receives data bit $X'_0$ via input $E_0$ of the circuit. At the output of adder $G_{0,3}$, $s=0 \oplus X'_0$, that is, $X'_0$. The signal provided by adder $G_{0,3}$ drives input $e_3$ of adder $G_{1,3}$, which calculates $X'_0 \oplus X'_1$. The calculation carries on in this way until adder $G_{19,3}$ is reached, which adds modulo 2 the result provided by adder $G_{15,3}$ and detection bit $C'_3$. Thus:

$$S_3 = X'_0 \oplus X'_1 \oplus X'_3 \oplus X'_5 \oplus X'_7 \oplus X'_9 \oplus X'_{11} \oplus X'_{15} \oplus C'_3,$$

which effectively corresponds to the multiplication of the fourth line of matrix M' by a vector having as components the bits of the word to be decoded. Generally, the decoding circuit of FIG. 4C has the structure of matrix M', the lines and columns of the circuit corresponding to the lines and columns of matrix M', an adder modulo 2 being placed where matrix M' includes a 1.

In the code described in relation with FIGS. 4A to 4D, the complementarity of two lines of the used matrixes makes it useless to calculate a total parity bit upon coding, conversely to prior art. This results in a time gain and a reduced number of adders. Further, the pattern formed by the adders is rather repetitive, which favors the circuit forming. In case of an error, the simple relation between the rank of the erroneous bit and the syndrome components further simplifies the error locating.

The circuit used for the coding corresponds to the decoding circuit, except for the last six columns, which do not exist for the coding. The outputs of the coding circuit provide the detection bits.

Of course, it is easy to generalize matrix M of FIG. 4A to code any even number m of bits. The number of detection bits r must be at least greater by 2 than the number necessary to binarily represent number m of bits of the word to be coded. Preferably, r will be equal to its minimum value, to avoid making the code too heavy. Thus, when m is equal to 16, four bits are required to binarily represent sixteen possibilities and r is chosen to be equal to 6, as seen previously. For m=32, the number of detection bits is chosen to be equal to 7, 32 being equal to 25. For m=128, 9 detection bits are required, and so on.

To generalize matrix M, number r of necessary detection bits is first determined. Then, matrix Mm used for the coding is built, so that the first r−2 elements of each column of even rank indicate, except for the first column, the column rank (it should be reminded that the rank of the first column is 0, and that of the last columns is m−1). To form the penultimate line, the line is separated in two portions of m/2 elements each. The first portion of the penultimate line (columns 0 to [m/2−1]) includes a "0" at each end and "1s" everywhere else. The second portion of the penultimate line (columns m/2 to m−1) includes a "1" at each end and "0s" everywhere else.

The last line of matrix Mm is complementary to the penultimate line, that is, the elements of the last line are the complements to 2 of the elements of the penultimate line.

The first r−2 elements of the first column of matrix Mm may be identical to the r−2 elements of any column, provided that the following conditions are respected: the first column must be different from all other columns; its first four elements must include at least two "1s", to be different from the columns of the matrix used upon decoding.

To form matrix M'm used for the decoding, parity control matrix Mm is first taken, and completed to the right with a square sub-matrix R of dimension r×r. Sub-matrix R includes "1s" on its main diagonal, and "0s" everywhere else except on its last line, the elements of which are the complements of those of the penultimate line of sub-matrix R. The last line of sub-matrix R thus includes "1s" everywhere except at the penultimate column.

The code using matrixes Mm and M'm has a minimum code distance equal to four. It enables correcting one error and detecting two errors. Upon decoding, the obtained syndrome has r components. A total parity bit is obtained by adding modulo 2 the last two syndrome components.

If the syndrome is the zero vector, there is no error. If the syndrome is different from the zero vector and the total parity bit is equal to "1", there is a single error. This error is easily corrected, since the first r−2 components of the syndrome indicate the rank of the erroneous bit, except for rank 0. If the syndrome is different from the zero vector and the total parity bit is equal to "0", two errors are present.

It should be noted that, like for matrix M', the last two lines of matrix M'm are complementary. The sum modulo 2 of the last two components of the obtained syndrome represent the sum modulo 2 of each of the data bits and of the detection bits, that is, a total parity bit, obtained without having had to calculate a total parity bit upon coding.

Figure 5A:
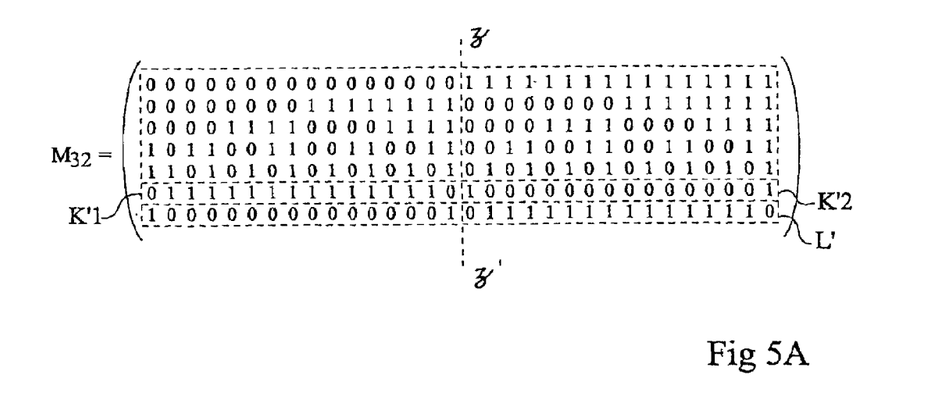
FIG. 5A shows a matrix according to the present invention for coding a 32-bit word.
Figure 5B:
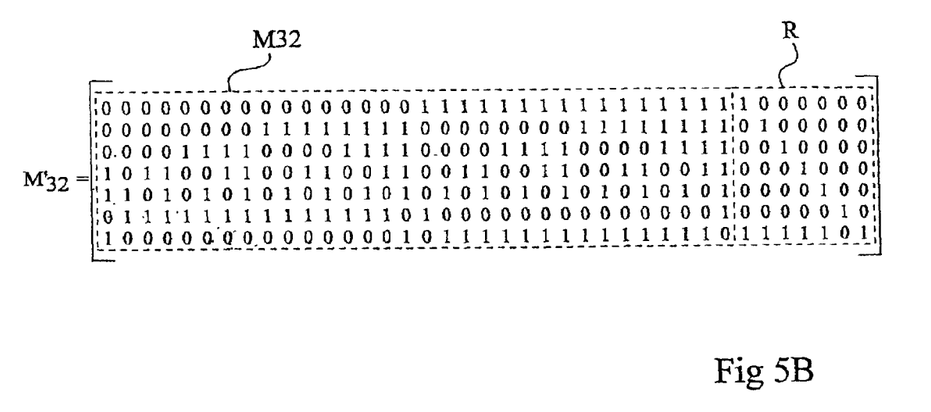
FIG. 5B shows a matrix used to decode words coded by means of matrix 5A.

FIGS. 5A and 5B respectively show, as an example, a matrix $M_{32}$ used to code 32-bit words and the corresponding matrix $M'_{32}$ used for the decoding. Matrix $M_{32}$ is a matrix of dimension 7×32 and matrix $M'_{32}$ is a matrix of dimension 7×39.

In FIG. 5A, a straight line zz' divides matrix $M_{32}$ in two portions of 16 columns each. Except for the column of rank 0, the first five elements of each column indicate the column rank. The penultimate line is formed of a block $K'_1$ to the left of straight line zz' and of a block $K'_2$ to the right of straight line zz'. Block $K'_1$ includes fourteen "1s" framed by two "0s", and block $K'_2$ includes fourteen "0s" framed by two "1s". The elements of last line L' are the complements of the elements of penultimate line $K'_1$, $K'_2$. Like for matrix M, the first 5 elements of the first column of matrix $M_{32}$ ("00011") have been chosen with two "1s" only. This has the advantage of reducing the number of adders, which results in a time and space gain for coding and decoding circuits.

In FIG. 5B, matrix $M'_{32}$ derives from matrix $M_{32}$ by the adding, to the right of a block corresponding to matrix $M_{32}$, of a block R of dimension 7×7 formed according to the general principles stated hereabove.

Of course, the present invention is likely to have various alterations, modifications, and improvements which will readily occur to those skilled in the art. In particular, the matrixes according to the present invention described hereabove are examples only and those skilled in the art may easily modify them. Thus, any line and/or column permutation in a matrix according to the present invention described hereabove is within the scope of the present invention.

The two complementary lines of the used matrixes are not necessarily formed by the elements described hereabove. They are not necessarily consecutive either.

Also, the matrixes used for the coding and/or the decoding may include more than one couple of complementary lines, if desired.

Number N of bits of the word to be coded may be even or odd, the matrixes used upon coding and/or decoding including at least one couple of two complementary lines. If number N is odd, a matrix Mm such as described hereabove with an even m equal to N+1 may for example first be formed. Then, matrix $M_N$ to be used upon coding may easily derive from matrix Mm by eliminating any column, for example, the first one or the last one.

Also, the present invention has mainly been described in the context of the storage of words in a memory. Of course, the present invention also applies to any coding and decoding of words to which an error detection and/or correction code is desired to be assigned. For example, the present invention applies to transmission.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for determining r error detection bits of a word of m bits that is to be coded, including a step of forming a vector with m components, each component corresponding to a bit of the word that is to be coded, and a step of multiplying, by a circuit, said vector by a parity control matrix, the result of said multiplying step being a vector formed of said r error detection bits, wherein the parity control matrix includes at least one couple of complementary lines.

2. The method of claim 1, wherein two or more than two lines and/or columns are permuted.

3. The method of claim 1, wherein number r of the detection bits is equal to n+2, n being the number of bits necessary to binarily represent number m of bits of the word that is to be coded.

4. A method for determining r error detection bits of a word of m bits that is to be coded, including a step of forming a vector with m components, each component corresponding to a bit of the word that is to be coded, and a step of multiplying, by a circuit, said vector by a parity control matrix, the result of said multiplying step being a vector formed of said r error detection bits, wherein the parity control matrix includes at least one couple of complementary lines, wherein m is an even number, and the parity control matrix is such that:
   a) a first half of a penultimate line, corresponding to the m/2 first columns, includes a "0" at each end and "1s" everywhere else,
   b) a second half of the penultimate line, corresponding to the last m/2 columns, includes a "1" it at each end and "0s" everywhere else, and
   c) a last line is complementary to the penultimate line.

5. A method for determining a syndrome, said method comprising a step of forming a vector with m+r components, each component corresponding to a bit of an m+r-bit word that is to be decoded, the m+r bits of said word that is to be decoded corresponding, before processing, to m bits of a word that is to be coded and r error detection bits obtained by a step of forming a vector with m components, each component corresponding to a bit of the word that is to be coded, and a step of multiplying, by a circuit, said vector by a parity control matrix, the result of said multiplying step being a vector formed of said r error detection bits, wherein the parity control matrix includes at least one couple of complementary lines, applied to the word of m bits that is to be coded, and a step of multiplying, by means of a computing circuit, said vector by a specific matrix, wherein the specific matrix includes:
   a) a first left-hand block corresponding to the parity control matrix used in the coding and;
   b) a second square block of dimension r-1, in the form of a diagonal matrix including only "1" on its diagonal,
   c) a last column only including "0s" on the r-1 first lines and a "1" on the last line, and
   d) under the second block, elements which are complements to two of those of the last line of the second block.

6. A system for determining r error detection bits of a word of m bits that is to be coded, comprising:
   means for forming a vector with m components, each component corresponding to a bit of the word that is to be coded; and
   a circuit to multiply said vector by a parity control matrix and provide said r error detection bits as a result of said multiplication, the parity control matrix including at least one couple of complementary lines.

7. A coding circuit enabling implementation of an error correction and/or detection code comprising a matrix that includes at least one couple of complementary lines, the circuit including elementary adders, a distribution of the elementary adders corresponding to the distribution of the "1s" in the matrix including lines and columns formed of elements equal to "1" or "0", in which at least two of said lines are formed of complementary elements.

8. The circuit of claim 7, wherein the elementary adders are formed by gates of XOR type.

9. A decoding circuit enabling implementation of an error correction and/or detection code comprising a matrix that includes at least one couple of complementary lines, the circuit including elementary adders, a distribution of the elementary adders corresponding to the distribution of the "1s" in the matrix including
   a) a first left-hand block corresponding to the parity control matrix used in the coding and;
   b) a second square block of dimension r-1, in the form of a diagonal matrix including only "1s" on its diagonal,
   c) a last column only including "0s" on the r-1 first lines and a "1" on the last line, and
   d) under the second block, elements which are complements to two of those of the last line of the second block.

10. The circuit of claim 9, wherein the elementary adders are formed by gates of XOR type.

11. A method for determining r error detection bits of a word of m bits that is to be coded, including a step of forming a vector with m components, each component corresponding to a bit of the word that is to be coded, and a step of multiplying, by a circuit, said vector by a parity control matrix, the result of said multiplying step being a vector formed of said r error detection bits, wherein the parity control matrix includes at least one couple of complementary lines, wherein a binary representation of the r-2 first bits of each column indicates the column rank, except for a first column, of rank 0.

* * * * *

UNITED STATES PATENT AND TRADEMARK OFFICE
CERTIFICATE OF CORRECTION

PATENT NO. : 7,225,386 B2 Page 1 of 1
APPLICATION NO. : 10/264312
DATED : May 29, 2007
INVENTOR(S) : Laurent Murillo

It is certified that error appears in the above-identified patent and that said Letters Patent is hereby corrected as shown below:

Col. 3, line 47 should read:
According to an embodiment of the present invention, m Col. 6, line 31 should read:
components. Each input $E_i$ is connected to a column of rank Signed and Sealed this Seventeenth Day of July, 2007

JON W. DUDAS
*Director of the United States Patent and Trademark Office*